(12) United States Patent
Specht et al.

(10) Patent No.: US 11,689,039 B2
(45) Date of Patent: Jun. 27, 2023

(54) METHOD AND SYSTEM FOR STATE-OF-CHARGE MONITORING OF AN AC BATTERY

(71) Applicant: Dr. Ing. h.c. F. Porsche Aktiengesellschaft, Stuttgart (DE)

(72) Inventors: Eduard Specht, Bruchsal (DE); Jan Kacetl, Kaiserslautern (DE); Tomas Kacetl, Kaiserslautern (DE); Malte Jaensch, Bietigheim-Bissingen (DE); Daniel Simon, Ludwigsburg (DE); Stefan Götz, Forstern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 13 days.

(21) Appl. No.: 17/518,899

(22) Filed: Nov. 4, 2021

(65) Prior Publication Data
US 2022/0140632 A1 May 5, 2022

(30) Foreign Application Priority Data
Nov. 5, 2020 (DE) .................... 10 2020 129 131.0

(51) Int. Cl.
*G01R 31/389* (2019.01)
*H02J 7/00* (2006.01)
(Continued)

(52) U.S. Cl.
CPC .......... *H02J 7/0048* (2020.01); *G01R 31/389* (2019.01); *G01R 31/3842* (2019.01);
(Continued)

(58) Field of Classification Search
None
See application file for complete search history.

(56) References Cited

U.S. PATENT DOCUMENTS 10,637,251 B2  4/2020  Helling et al.
11,038,435 B2  6/2021  Götz
(Continued)

FOREIGN PATENT DOCUMENTS

DE  102014110410 A1  1/2016
DE  102017124126 A1  4/2019

OTHER PUBLICATIONS

Goetz et al., "Modular Multilevel Converter With Series and Parallel Module Connectivity: Topology and Control," Power Electronics, IEEE Transactions on Power Electronics, vol. 30, No. 1, 2015, pp. 203-215.

*Primary Examiner* — Jas A Sanghera
(74) *Attorney, Agent, or Firm* — RatnerPrestia

(57) ABSTRACT

A method for state-of-charge monitoring of an AC battery, in which the battery includes a central controller having a scheduler, measuring sensors and at least two battery modules. The at least two battery modules each have at least one energy storage element and at least two power semiconductor switches, which connect the respective battery module in series or in parallel or in bypass with another battery module. The battery is controlled by the central controller, and a respective switching state of the at least two battery modules is preset by the scheduler. The state-of-charge monitoring is implemented by a control program within the scheduler. During operation of the battery, a state of each individual energy storage element is monitored by virtue of a respective current flow at a respective energy storage element being determined using continued evaluation of measured values of preset battery parameters which are detected by measuring sensors.

10 Claims, 2 Drawing Sheets

(51) Int. Cl.
*G01R 31/3842* (2019.01)
*H01M 10/42* (2006.01)
*H01M 10/48* (2006.01)

(52) U.S. Cl.
CPC ..... *H01M 10/4257* (2013.01); *H01M 10/482* (2013.01); *H02J 7/0024* (2013.01); *H02J 7/0071* (2020.01); *H02J 7/00712* (2020.01); *H01M 2010/4278* (2013.01)

(56) References Cited

U.S. PATENT DOCUMENTS

| | | |
|---|---|---|
| 2010/0026237 A1 | 2/2010 | Ichikawa et al. |
| 2012/0072063 A1 | 3/2012 | Kato et al. |
| 2013/0297243 A1 | 11/2013 | Baba et al. |
| 2013/0300425 A1 | 11/2013 | Shiraishi et al. |
| 2015/0100259 A1* | 4/2015 | Driemeyer-Franco ...................... G01R 31/3842 702/63 |
| 2015/0158395 A1 | 6/2015 | Li et al. |
| 2016/0089992 A1* | 3/2016 | Le ....................... H02J 7/00047 320/109 |
| 2018/0109202 A1 | 4/2018 | Marquardt |
| 2018/0312160 A1 | 11/2018 | Obitsu |
| 2019/0339330 A1 | 11/2019 | Bryngelsson et al. |

* cited by examiner

METHOD AND SYSTEM FOR STATE-OF-CHARGE MONITORING OF AN AC BATTERY

CROSS-REFERENCE TO RELATED APPLICATION

This application claims priority to German Patent Application No. 10 2020 129 131.0, filed Nov. 5, 2020, the content of such application being incorporated by reference herein in its entirety.

FIELD OF THE INVENTION

The present invention relates to a method for state-of-charge monitoring which is implemented within a controller of an AC battery. In addition, a system on which the method is implemented is set forth.

BACKGROUND OF THE INVENTION

Inverters which convert a DC voltage of a traction battery into a desired AC voltage are used for supplying energy to a traction engine of an electric vehicle. A development of conventional hard-wired batteries constitutes modern inverters, for example formed by modular multilevel converters, in which a plurality of electrically connected modules, which each have at least one energy storage element and a plurality of semiconductor switches for connecting the energy stores between the modules, are arranged in at least one module string. By virtue of dynamic connection, thus an AC voltage can be generated from a DC voltage of the energy stores, for example for operating an electric machine. An example of this is represented by the modular multilevel converter, also referred to as MMC or M2C for short, disclosed by R. Marquardt in US 2018/0109202, which is incorporated by reference herein. Usually, a central control device controls the respective connection of the modules. As accurate an estimation of a state of charge of the respective energy stores as possible is in this case of essential significance in order to avoid an uneven load distribution between the energy stores by means of suitable control.

US 2013/0300425 A1, which is incorporated by reference herein, describes a management system for an electrical storage device, which comprises a voltage sensor, a computer memory, and a controller. The voltage sensor measures a voltage at an electrical storage device, wherein a correlation between an off-load voltage and a state of charge including a region of slight change and a region of severe change is detected and stored in the computer memory. With these data, the controller is capable of determining the state of charge of the electrical storage device.

In US 2015/0158395 A1, which is incorporated by reference herein, the state of charge of a traction battery is determined from operational parameters such as cell voltages and impedances. A controller for this purpose implements a state monitor in order to calculate these values on the basis of modelling of a current measurement bias at each energy cell which is dependent on such operational parameters.

US 2019/0339330 A1, which is incorporated by reference herein, discloses a method for estimating a state of charge for a battery cell, wherein in particular various operating states of the battery cell are taken into consideration. The estimation is based on measurements of a mean current value for each battery cell.

SUMMARY OF THE INVENTION

An estimation of the state of charge based on an integration of measured current values can be relatively inaccurate, despite the considerable complexity involved in measuring sensors distributed over the traction battery. In addition, such distributed measurements are performed by a control device, with the result that a central controller can only influence the state of charge by a control algorithm after measurement processing and data transmission.

Against this background, described herein is a method for state-of-charge monitoring of an AC battery, wherein the state-of-charge monitoring is implemented on a central controller of the AC battery and improved estimation of the state of charge is provided which is not only based on measured current values. In addition, a system on which the method is implemented will be set forth.

A method is proposed for state-of-charge monitoring of an AC battery, in which the AC battery comprises a central controller having a scheduler, measuring sensors and at least two battery modules. The at least two battery modules each have at least one energy storage element and at least two power semiconductor switches, which connect the respective battery module in series or in parallel or in bypass with another battery module. The AC battery is controlled by the central controller, wherein a respective switching state of the at least two battery modules is preset by the scheduler, and the state-of-charge monitoring is implemented by a control program within the scheduler. During operation of the AC battery, a state of each individual energy storage element is monitored by virtue of a respective current flow at a respective energy storage element being determined using continued evaluation of measured values of preset battery parameters which are detected by measuring sensors, and from this a measurement state of charge being estimated. Furthermore, a respective current flow is calculated using continued logging of the respective switching states, of a respective phase current, of a respective phase voltage and of impedances present given respective switching states of the AC battery, and from this a monitoring state of charge is estimated. The state-of-charge monitoring is formed from a combination of the measurement state of charge and the monitoring state of charge.

The combination of the measurement state of charge and the monitoring state of charge is implemented, for example, by means of a Kalman filter. The method according to aspects of the invention therefore advantageously improves precision and quality of the state-of-charge monitoring.

The impedances result from impedances of the respective power semiconductor switches, the respective energy stores, the respectively switched battery modules and the respectively resulting current characteristic in current-conducting lines.

The continued evaluation of measured values detected by measuring sensors means that the evaluation of measured values is implemented in each case newly at or with a preset switching clock, with which the power semiconductor switches of the at least two battery modules are also switched.

For the driving of the AC battery, which needs to be coordinated temporally and in a manner dependent on the respective state of charge, a software-based hardware implementation in accordance with the method according to aspects of the invention is advantageous since adaptations in the finite-state machine to a software-controlled vehicle-wide system and/or a software-controlled AC battery, for example a modular multilevel converter having series and parallel connectivity, for example described in Goetz, S. M.; Peterchev, A. V.; Weyh, T., "Modular Multilevel Converter With Series and Parallel Module Connectivity: Topology and Control," IEEE Transactions on Power Electronics, vol. 30, no. 1, pp. 203, 215, 2015. doi: 10.1109/TPEL.2014.2310225, can be performed in a simple, uncomplicated and purely software-based manner.

The AC battery can actively set, by virtue of respective series-parallel connection of its battery modules with one another, a terminal voltage between a negative absolute value and a positive absolute value of a maximum voltage (factor N of a battery module voltage, where N is a number of battery modules). Also, beyond the terminal voltage resulting from a series or parallel connection or possible combinations thereof, any desired value resulting when averaged over time between the negative absolute value and the positive absolute value of the maximum voltage for the terminal voltage can be set by high-frequency switchover or connection and disconnection of individual battery modules. The setting is implemented by the control program on the central controller, which controls the series-parallel connection of the battery modules taking into consideration the respective states of the energy stores.

In one embodiment of the method according to aspects of the invention, the preset battery parameters are selected from the following list: phase current, voltage at each energy store, battery module impedance, control signals, parallel/series/bypass switching configuration of the respective battery modules. A plurality of battery modules of the AC battery are arranged, for example, next one another in a row in a respective string, wherein the respective string forms the respective phase current of an electric motor of a vehicle. The battery module impedance comprises an impedance matrix of impedance values of respective switches of the battery modules, energy stores, lines etc. A respective measuring sensor, such as, for example, a phase current sensor, can measure the respective phase current of the AC battery in the connection thereof to the electric motor. In order to measure the voltage at each energy store, a respective measuring sensor is arranged in the respective battery module.

In a further embodiment of the method according to aspects of the invention, the scheduler is implemented on a processor unit and an FPGA. The switching states and the monitoring state of charge are determined on the FPGA, and the measurement state of charge is determined on the processor unit. The FPGA is an abbreviation for "Field-Programmable Gate Array". For example, on starting of the electric vehicle having the driving of the AC battery in accordance with the invention, a respective processor programming is configurable on an FPGA. The FPGA can advantageously be connected to a microcontroller or the FPGA can additionally comprise a microcontroller. In a further continued embodiment, it is also conceivable for the control program to be implemented on a microcontroller or an "Application-Specific Integrated Circuit" or ASIC. A combination of a microcontroller and an FPGA/ASIC represents a further advantageous embodiment. Owing to a direct physical vicinity of the calculations for the monitoring state of charge on the FPGA and the measurement state of charge on the adjacent processor unit, advantageously a process of combining to give the state-of-charge monitoring which is as quick as possible is enabled. The scheduler can therefore have direct access to this state-of-charge monitoring without any transmission-related time losses.

In yet a further embodiment of the method according to aspects of the invention, the respective current flow is calculated for estimating the monitoring state of charge in accordance with an assignment table, which has a respective current value for all of the switching states and possible combinations of the battery modules. In a conceivable model-based approach to monitoring of operating states of the battery modules, measured values from the measuring sensors are used to continually update the assignment table.

In yet a further continued embodiment of the method according to aspects of the invention, the respective current flow is calculated for estimating the monitoring state of charge using a simplified function, which contains a distribution matrix in respect of the respective voltages of the energy stores together with the battery module impedances. Simplification means here that at least one of the parameters influencing the respective current flow is set to be constant. Thus, for example, a current flow $I_k$ through a battery module k is given by $$I_k = f(S, i_{phase}, Z, V_k), \quad (1)$$

where s is a respective configuration of switching states, $i_{phase}$ is the phase current, Z is a matrix with battery module impedances and a vector V with a k-th element $V_k$ contains a voltage of the energy storage element of the battery module k. The matrix with battery module impedances Z and the vector V are combined to give a distribution matrix D:

$$I_k = f(S, i_{phase}, D(Z, V_k)). \quad (2)$$

If now, in accordance with the yet further continued embodiment, for example the distribution matrix D is simplified by constant inputs, this gives $$I_k = f(S, i_{phase}, D). \quad (3)$$

Thus, for example, an impedance value of a power semiconductor switch in comparison with the battery module impedance can be set to be equal to zero.

In addition, a system for state-of-charge monitoring of an AC battery is provided, in which the AC battery comprises a central controller having a scheduler, measuring sensors and at least two battery modules. The at least two battery modules each have at least one energy storage element and at least two power semiconductor switches, which connect the respective battery module in series or in parallel or in bypass with another battery module. The central controller is configured to control the AC battery, and the scheduler is configured to preset a respective switching state of the at least two battery modules. A state-of-charge monitor is implemented within the scheduler by a control program and is configured, during operation of the AC battery, to determine a respective current flow at a respective energy storage element using continued evaluation of measured values of preset battery parameters which are detected by measuring sensors, and from this to estimate a measurement state of charge, further to calculate a respective current flow using continued logging of the respective switching states, of a respective phase current, of a respective phase voltage and of impedances present given respective switching states of the AC battery, and from this to estimate a monitoring state of charge, and to form the state-of-charge monitoring from a combination of the measurement state of charge and the monitoring state of charge.

By means of the state-of-charge monitor, during operation of the AC battery, a state of charge of each individual energy storage element is monitored, and in addition a respective current flow at a respective energy storage element is estimated using continued evaluation of measured values of preset battery parameters and, by integration or accumulation of the respective current flows, a conclusion is drawn as to a state of charge of the respective energy store. In addition to measured values, the state-of-charge monitor also evaluates control signals for a respective switching cycle. Thus, the state-of-charge monitor knows from the central controller how the battery modules are connected to one another (in parallel or in series) and from this calculates a current distribution.

In terms of control theory, the state-of-charge monitor according to aspects of the invention is a system which provides an estimation of an internal state of charge of a given real system from measurements of an input and an output of the real system. It therefore provides a basis for many applications in order to implement control of the modular AC battery, such as, for example, by dynamic driving of the power semiconductor switches in a respective battery module in accordance with the state-of-charge monitoring of the respective energy store, a compensated load distribution.

In one configuration of the system according to aspects of the invention, the preset battery parameters are selected from the following list: phase current, voltage at each energy store, battery module impedance, control signals, parallel/series/bypass switching states of the respective battery modules.

In a further configuration of the system according to aspects of the invention, the scheduler is configured to be implemented on a processor unit and an FPGA. The switching states and the monitoring state of charge are determined on the FPGA, and the measurement state of charge is determined on the processor unit.

In yet a further configuration of the system according to aspects of the invention, the state-of-charge monitor is configured to perform the calculation of the respective current flow for estimating the monitoring state of charge in accordance with an assignment table, which has a respective current value for all of the switching states and possible combinations of the battery modules.

In yet a further continued configuration of the system according to aspects of the invention, the state-of-charge monitor is configured to perform the calculation of the respective current flow for estimating the monitoring state of charge using a simplified function, which contains a distribution matrix in respect of the respective voltages of the energy stores together with the battery module impedances.

Further advantages and configurations of the invention result from the description and the attached drawings.

It goes without saying that the features mentioned above and the features yet to be explained below are applicable not only in the respectively given combination, but also in other combinations or on their own without departing from the scope of the present invention.

BRIEF DESCRIPTION OF THE DRAWINGS

The figures are described cohesively and comprehensively; the same components are assigned the same reference symbols.

DETAILED DESCRIPTION OF THE INVENTION

Figure 1:
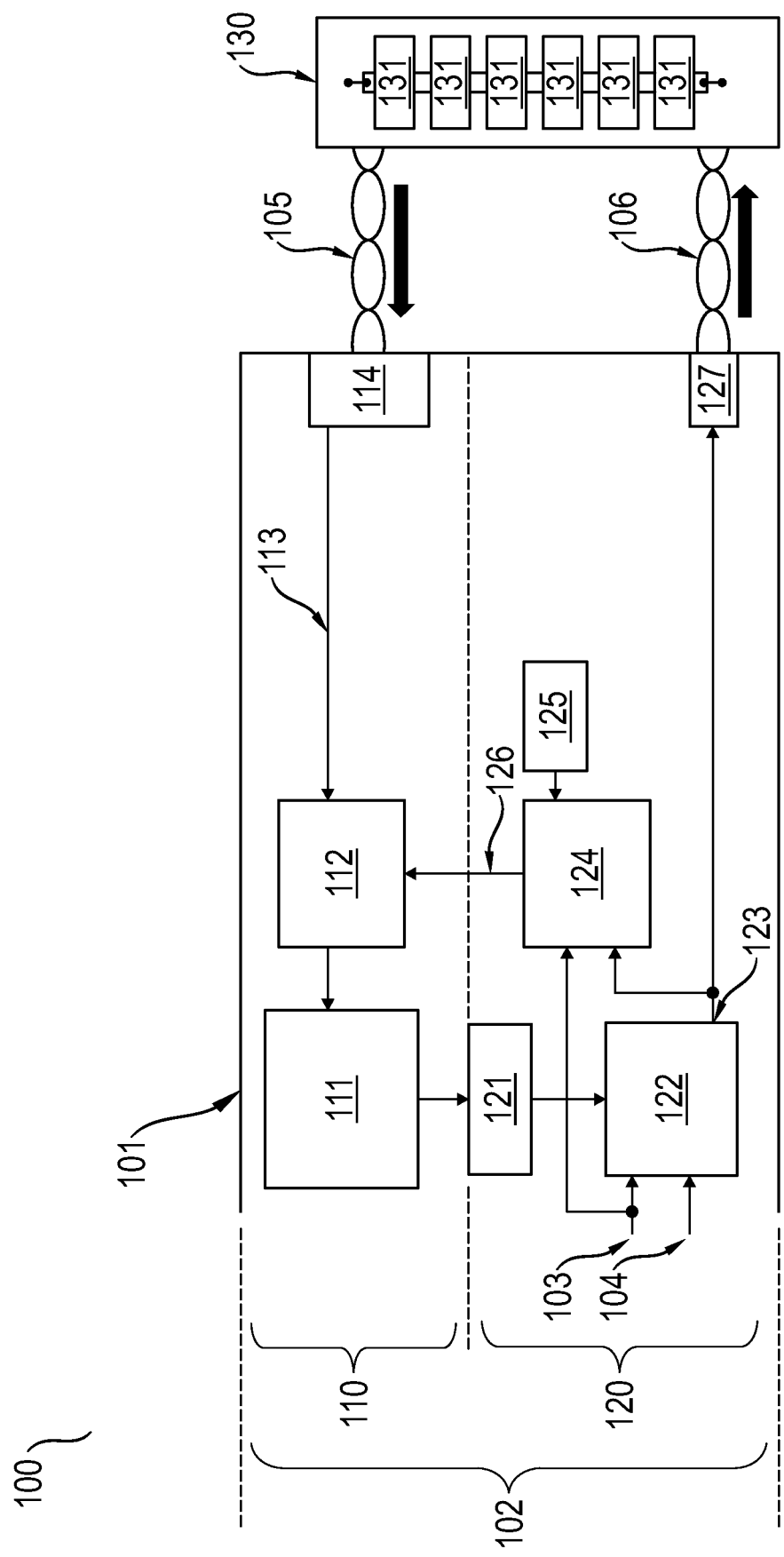
FIG. 1 shows, schematically, a wiring diagram for state-of-charge monitoring in one embodiment of the method according to aspects of the invention.

FIG. 1 shows, schematically, a wiring diagram 100 for a state-of-charge monitoring in one embodiment of the method according to aspects of the invention, in which a scheduler 102 is implemented on a central controller 101, partly on a processor 110 and partly on an FPGA 120. A desired phase current $I_{phase}$ 103 given a desired phase voltage $V_{phase}$ 104 is preset to the scheduler 102 by the central controller 101 in order to select a switching state configuration 122. Stored values of a cost function 121, which evaluate respective switching states in accordance with the switching losses caused, for example, by a change to them, are also used in the selection of the switching state configuration 122. A selected switching state 123 is used firstly for continued logging of the selected switching configuration 123 and therefore as a basis for a state-of-charge monitoring 124, in which the desired phase current $I_{phase}$ 103 is also used, and a stored distribution matrix 125 with voltages and impedances/resistances with respect to the respectively switched switching configuration 123 of the AC battery 130. On the other hand, the selected switching state 123 is passed to a transmission unit 127, which transmits said switching state over a control bus 106 to a modular AC battery 130. In the battery modules 131 of the AC battery 130, the selected switching configuration 123 is implemented, which results in a measured phase current. Respective voltages at energy stores of the respective battery modules 131 are also measured. Such measured values and further measured values, such as, for example, temperature, are transmitted on a data bus 105 to a reception unit 114 of the central controller 101, whereupon a measurement state of charge 113 for fusioning 112 with the monitoring state of charge 126 is combined. The estimation of the state of charge obtained on the basis of the fusioning 112 is again supplied to a calculation of the cost function 111, in which, for example, changes to all possible switching states are newly evaluated and stored as values of the cost function 111.

Figure 2:
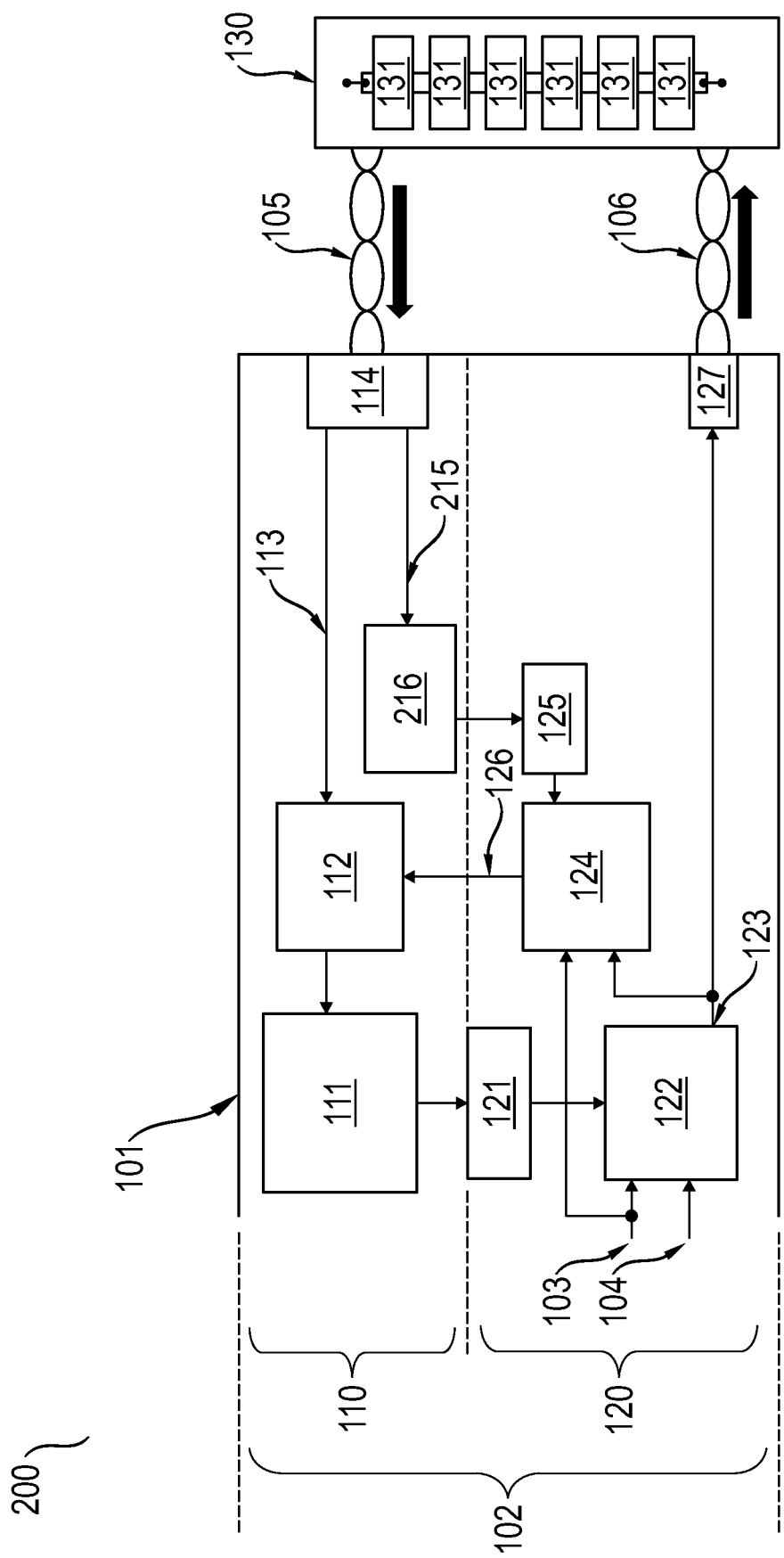
FIG. 2 shows, schematically, a wiring diagram with updating of a distribution matrix in a further embodiment of the method according to aspects of the invention.

FIG. 2 shows, schematically, a wiring diagram 200 with updating of a distribution matrix in a further embodiment of the method according to aspects of the invention. The voltage values 215 of energy stores obtained from the reception unit 114 are used for continued recalculation 216 of a distribution matrix with voltages and impedances/resistances to give the switching configuration 123 which is respectively implemented by the AC battery 130 and which is then stored as distribution matrix 125.

What is claimed is:

1. A method for state-of-charge monitoring of an AC battery, in which the AC battery comprises a central controller having a scheduler, measuring sensors and at least two battery modules, wherein the at least two battery modules each have at least one energy storage element and at least two power semiconductor switches, which connect the respective battery module in series or in parallel or in bypass with another battery module, wherein the AC battery is controlled by the central controller, and a respective switching state of the at least two battery modules is preset by the scheduler, wherein the state-of-charge monitoring is implemented by a control program within the scheduler, wherein, during operation of the AC battery, the method comprising:

determining a respective current flow at a respective energy storage element using continued evaluation of measured values of preset battery parameters which are detected by measuring sensors, estimating a measurement state of charge based upon the determining step, calculating a respective current flow using continued logging of the respective switching states of the at least two battery modules, of a respective phase current, and of impedances present given respective switching states of the AC battery, wherein the respective switching states of the at least two battery modules indicate whether the respective battery module is connected in series or in parallel or in bypass with another battery module, estimating a monitoring state of charge based upon the calculating step, and forming state-of-charge monitoring from a combination of the measurement state-of-charge and the monitoring state of charge.

2. The method as claimed in claim 1, further comprising selecting the preset battery parameters from the following list: phase current, voltage at each energy storage element, battery module impedance, control signals, and/or parallel/series/bypass switching states of the respective battery modules.

3. The method as claimed in claim 1, wherein the scheduler is implemented on a processor unit and an FPGA, wherein the switching states and the monitoring state of charge are determined on the FPGA, and the measurement state of charge is determined on the processor unit.

4. The method as claimed in claim 1, further comprising calculating the respective current flow for estimating the monitoring state of charge in accordance with an assignment table, which assignment table has a respective current value for all of the switching states and possible combinations of the battery modules.

5. The method as claimed in claim 1, further comprising calculating the respective current flow for estimating the monitoring state of charge using a simplified function, which simplified function contains a distribution matrix in respect of the respective voltages of the energy storage elements together with the battery module impedances.

6. A system for state-of-charge monitoring of an AC battery, in which the AC battery comprises a central controller having a scheduler, measuring sensors and at least two battery modules, wherein the at least two battery modules each have at least one energy storage element and at least two power semiconductor switches, which connect the respective battery module in series or in parallel or in bypass with another battery module, wherein the central controller is configured to control the AC battery, and the scheduler is configured to preset a respective switching state of the at least two battery modules, wherein a state-of-charge monitor within the scheduler is implemented by a control program and is configured, during operation of the AC battery, (a) to determine a respective current flow at a respective energy storage element using continued evaluation of measured values of preset battery parameters which are detected by measuring sensors, (b) to estimate a measurement state of charge based upon the determination at (a), (c) to calculate a respective current flow using continued logging of the respective switching states of the at least two battery modules, of a respective phase current, and of impedances present given respective switching states of the AC battery, wherein the respective switching states of the at least two battery modules indicate whether the respective battery module is connected in series or in parallel or in bypass with another battery module, (d) to estimate a monitoring state of charge from the calculation at (c), and (e) form the state-of-charge monitoring from a combination of the measurement state of charge and the monitoring state of charge.

7. The system as claimed in claim 6, in which the preset battery parameters are selected from the following list: phase current, voltage at each energy storage element, battery module impedance, control signals, and/or parallel/series/bypass switching states of the respective battery modules.

8. The system as claimed in claim 6, wherein the scheduler is configured to be implemented on a processor unit and an FPGA, wherein the switching states and the monitoring state of charge are determined on the FPGA, and the measurement state of charge is determined on the processor unit.

9. The system as claimed claim 6, wherein the state-of-charge monitor is configured to perform the calculation of the respective current flow for estimating the monitoring state of charge in accordance with an assignment table, which assignment table has a respective current value for all of the switching states and possible combinations of the battery modules.

10. The system as claimed in claim 6, wherein the state-of-charge monitor is configured to perform the calculation of the respective current flow for estimating the monitoring state of charge using a simplified function, which simplified function contains a distribution matrix in respect of the respective voltages of the energy storage elements together with the battery module impedances.

* * * * *